United States Patent [19]

Hoeberechts

[11] 4,251,909

[45] Feb. 24, 1981

[54] METHOD OF MANUFACTURING A TARGET ASSEMBLY FOR A CAMERA TUBE

[75] Inventor: Arthur M. E. Hoeberechts, Eindhoven, Netherlands

[73] Assignee: U.S. Philips Corporation, New York, N.Y.

[21] Appl. No.: 37,267

[22] Filed: May 9, 1979

Related U.S. Application Data

[62] Division of Ser. No. 808,786, Jun. 22, 1977, Pat. No. 4,166,969.

[30] Foreign Application Priority Data

Jun. 29, 1976 [NL] Netherlands ........................ 7607095

[51] Int. Cl.[3] ............................................ H01L 31/00

[52] U.S. Cl. ........................................ 29/580; 29/589; 156/630; 156/657; 313/366

[58] Field of Search ............... 156/629, 630, 633, 657, 156/662, 644; 29/572, 577, 578, 580, 589, 591, 592 R; 313/365, 366, 367, 371, 384

[56] References Cited

U.S. PATENT DOCUMENTS

| | | | |
|---|---|---|---|
| 3,725,711 | 4/1973 | Sadler | 313/366 |
| 3,814,965 | 6/1974 | Matsumura | 313/371 |
| 4,039,888 | 8/1977 | Ashikawa et al. | 313/365 |
| 4,070,230 | 1/1978 | Stein | 156/657 |
| 4,103,203 | 7/1978 | Ochs | 313/366 |
| 4,107,568 | 8/1978 | Nakano et al. | 313/371 |

*Primary Examiner*—Jerome W. Massie
*Attorney, Agent, or Firm*—Marc D. Schechter

[57] ABSTRACT

A target and target assembly for a camera tube in which a semiconductor plate is provided on an annular support. The plate has a semiconductor monocrystalline edge portion which comprises an integrated circuit for processing the electrical signals originating from the target. The central portion of the plate is provided with a radiation-sensitive layer having one or more radiation-permeable electrodes. The integrated circuit is provided with inputs which are connected to the electrodes and with leads for the supply and control voltages. A window is provided on the electrodes and overlaps the inner edge of the support, the window, the edge portion and the support adjoining each other in a vacuum-tight manner.

8 Claims, 14 Drawing Figures

METHOD OF MANUFACTURING A TARGET ASSEMBLY FOR A CAMERA TUBE

This is a division of application Ser. No. 808,786 filed June 22, 1977 now U.S. Pat. No. 4,166,969.

BACKGROUND OF THE INVENTION

The invention relates to a semiconductor target having a radiation-sensitive layer for converting radiation into electrical signals, the radiation-sensitive layer, on the side of the incident radiation, having at least one electrode which is permeable to that radiation.

The invention also relates to a target assembly for a camera tube which has such a semiconductor target and is provided with a window on one side of the target which passes the radiation incident on the radiation-sensitive layer. The target is further provided with a support such as a ring of electrically insulating material.

The invention furthermore, relates to a camera tube comprising such a target assembly, and to a method of manufacturing the target assembly.

Targets and target assemblies of the type described above are generally known. The charge image and potential image, respectively, generated by the radiation (which may be both of an electromagnetic and of a corpuscular nature, in accordance with the application) are scanned by an electron beam and the electrical signals originating from the electrode(s) are further processed as a picture signal in a circuit arrangement suitable for that purpose.

The signals originating from the electrode or electrodes will in general, first be supplied to a sub-circuit which provides at its output the signal in a transformed form, for example in an amplified form, a signal with an impedance transformation or delay, which is then supplied for further processing to the remaining part of the circuit.

For high signal-to-noise ratio, it is of great importance that the signal originating from the electrode(s) should be supplied to the subcircuit via a capacitance which is as low as possible. This often presents problems in known target assemblies in which the electrodes of the target are connected, inter alia, to the camera tube holder and hence provide a rather large input capacitance.

SUMMARY OF THE INVENTION

One of the objects of the invention is to provide a target which minimizes the number of glass lead throughs or even obviate the need for glass lead-throughs entirely.

Another object of the invention is to provide a target assembly which can be manufactured in a technologically advantageous manner, easily mounted in the camera tube and in which the input capacitance for the signal originating from the electrode or electrodes of the target is considerably lower than in known constructions.

Another object of the invention is to provide a camera tube which has such a very efficacious target assembly.

Still a further object of the invention is to provide a particularly advantageous method of manufacturing such a target assembly.

The invention is, inter alia, based on the discovery that these goals can be achieved by providing the above-mentioned sub-circuit in the form of an integrated circuit together with the target in one semiconductor plate and by also using the portion of the semiconductor plate comprising the integrated circuit in a suitable manner during the sealing of the target assembly.

It is to be noted that the term integrated circuits as used herein should be interpreted broadly as a circuit comprising one or more semiconductor circuit elements provided in the semiconductor plate. The circuit may in certain circumstances consist of any one semiconductor element, for example one transistor, with associated connection conductors.

Therefore, a target of the aforesaid kind, in accordance with the invention, has a thick monocrystalline edge portion with a circuit integrated therein. The integrated circuit has at least one semiconductor circuit element for processing the electrical signals originating from the permeable electrode, and from a thinner control portion which has the radiation-sensitive layer with the permeable electrode provided thereon, the electrode being d.c. connected to an input of the integrated circuit.

The invention is particularly applicable to those cases in which the electrodes consist of a large number of stripes which extend substantially parallel to each other. Such a target is disclosed, for example, in U.S. Pat. No. 2,446,249, in which the stripe-shaped electrodes are divided into three groups to provide, for example, a "red", a "blue" and a "green" picture signal. In some cases, it is desirable to supply the respective picture signals originating from each stripe-shaped electrode for processing to an input of a shift register having one or more outputs which are connected to further portions of the signal processing circuit. Such a system is described, for example, in Applicants' non-prepublished Netherlands patent application No. 76 01 361, corresponding to U.S. Pat. No. 4,059,840, the contents of which, pertinent to the present invention, is to be considered as being incorporated in this application.

The invention provides a construction in which such a combination of stripe-shaped electrodes and one or more shift registers can be realised in a very advantageous manner with a drastic reduction of the required number of external connections. The shift register is integrated in the semiconductor plate thus obviating the need for glass lead-throughs to the target such as those found in conventional cameras of this type. In addition, since the integrated circuit is not located in the envacuated tube, it causes very little, if any, disturbance to the electrical field distribution in the vicinity of the target.

According to the invention, a target assembly of the aforesaid kind is further characterized in that the edge portion of the side of the target remote from the incident radiation is secured in a vacuum-tight manner to an annular support. The window is secured to that edge portion in a vacuum-tight manner and, in projection, extends at least up to the inner edge of the annular support. The output connections and the control and supply voltage leads of the integrated circuit are connected to conductive layers on the edge portions. The layers extend at least partly outside the window and are connected to conductors outside the window.

One of the important advantages of the target assembly according to the invention is that the signal input capacitance can be very low since the electrode or electrodes rather than being connected directly to the camera tube holder, are connected directly to the input of the integrated circuit. Furthermore, glass leadthroughs through the tube are in principle not necessary and, in contrast with known constructions, the pressure-resistant window is of considerably smaller size than the cross-section of the camera tube.

In order to increase the pressure resistance of the construction, the entire edge of the window may overlap the inner edge of the support, although in certain circumstances it may be sufficient for the edges of the window and the support to coincide. As a result of this, stresses in the semiconductor plate are minimized.

Another important advantage of the target assembly according to the invention is that the gauze te or mesh electrode, used in known camera tubes to provide a favourable field for substantially perpendicular incidence of the electron beam, can be integrated in the target assembly in a simple manner. To this end the gauze plate is arranged on the side of the support remote from the target and the edge of the plate is conductively connected to a metallisation provided on the edge of the support.

The vacuum-tight connection of the window to the edge portion of the target is advantageously effected by securing the window to an insulating layer, for example a glass layer, extending on the side of the incident radiation over the target, the electrodes and the metal layers thereon.

The invention moreover, makes it possible, when using mutually parallel stripe-shaped electrodes, to integrate in a very suitable manner a colour filter in the target assembly. The colour filter is arranged between the window and the stripe-shaped electrodes and comprises bands of different spectral permeability extending parallel to the stripe-shaped electrodes.

A particularly suitable method of manufacturing a target assembly of the kind described employs a semiconductor plate of substantially homogeneous thickness as the starting material. The integrated circuit is formed in an edge portion of one side of the plate. the central portion of the plate on said one side is then provided with at least one electrode which is permeable to radiation and which is d.c. connected to an input of the integrated circuit. The outputs of the integrated circuit are provided with metal layers which extend on the edge portion. The edge portion of the other side of the semiconductor plate is then secured, in a vacuum-tight manner, to an annular support of an electrically insulating material. The radiation pervious window is secured to the one side of the plate in a manner such that the edge of the window extends at least up to the inner edge of the support, with the layers projecting beyond the window. The central portion of the other side of the semiconductor plate is then subjected to a material-removing treatment until the material of the central portion is removed entirely and the permeable electrode becomes exposed in the resulting aperture. Thereafter a radiation-sensitive layer is provided on the exposed electrode.

BRIEF DESCRIPTION OF THE DRAWINGS

The invention will now be described in greater detail with reference the drawings, in which:

FIG. 3 is a diagrammatic plan view of the target assembly of which FIG. 1 is a cross-sectional view taken on the line I—I.

The figures are diagrammatic and not drawn to scale. Corresponding parts are as a rule referred to by the same reference numerals.

DESCRIPTION OF THE PREFERRED EMBODIMENTS

Figure 1:
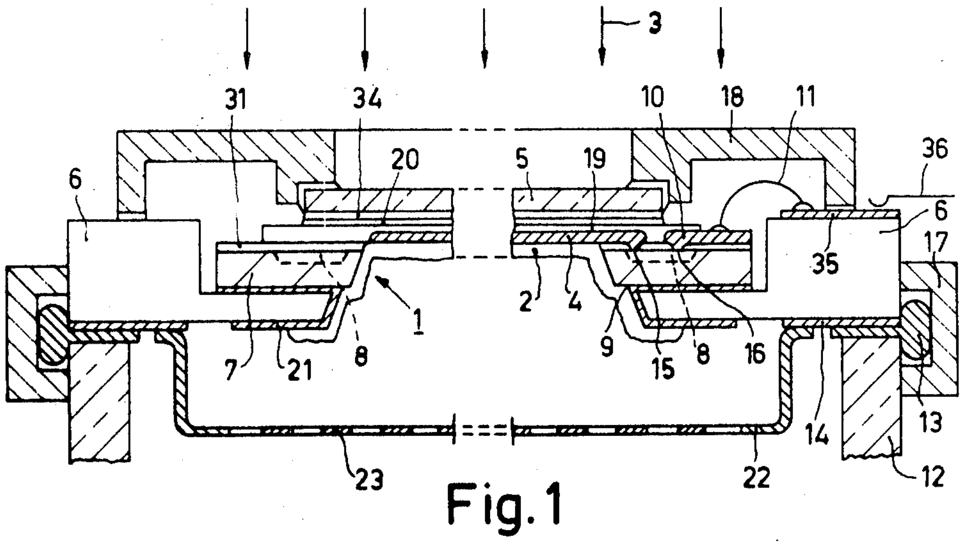
FIG. 1 is a diagrammatic cross-sectional view of a target assembly having a target according to the invention.

FIG. 1 is a diagrammatic cross-sectional view of a target assembly for a camera tube having a target according to the invention. The target assembly comprises a semiconductor target 1, in this embodiment of p-type silicon, having a radiation-sensitive layer 2, for example, of antimony trisulphide, for converting radiation (denoted in FIG. 1 by the arrows 3) into electrical signals. On the side of the incident radiation 3, the radiation-sensitive layer 2 has at least one electrode 4 which is permeable to the incident radiation. In this embodiment a number of mutually substantially parallel stripe-shaped permeable electrodes $4_1$, $4_2$, $4_3$, etc. are provided, as will be obvious from the diagrammatic plan view of FIG. 3.

According to the invention, the target further includes an edge portion 7 of monocrystalline silicon and a central portion provided with the radiation-sensitive layer 2. Edge portion 7 has an integrated circuit for processing the electrical signals originating from the permeable electrodes 4 which are d.c. connected to an input 15 of the integrated circuit. The integrated circuit, which may be made in various ways and is not shown in detail in FIGS. 1 to 9, is located within the area 8 of the edge portion 7 shown by dotted lines. According to the invention, the target assembly is constructed so that the target is secured to the support 6 consisting of a ring of insulating material in a vaccuum-tight manner with the side of its edge portion 7 remote from the incident radiation 3. Disposed on the side of the incident radiation 3 is a glass window 5, through which radiation 3 passes and is incident on the layer 2. The window 5 is secured to the edge portion 7 in a vacuum-tight manner and in projection extends at least up to, and in the embodiment shown in FIG. 1, overlaps the inner edge 9 of the annular support 6. According to the invention, the connections 16 of the outputs and the leads of the integrated circuit necessary for supply and control voltage are connected to conductive layers 10 which extend at least partly outside window 5 on the edge portion 7 and have connection conductors 11 outside the window 5. The outer edge of the support 6 has a thicker outer edge portion which is at least partly metallized on the side of the incident radiation 3. The connection leads 11 connected to the connections 16 of the integrated circuit for the output, supply and control voltages are connected to the metallized portion 35 and an external conductor 36 also adjoins the metallization 35 as shown in FIG. 1.

The target assembly and the support 6 can be secured to the glass envelope 12 of the camera tube, for example, by means of an indium weld or seal 13 which bands a metal layer 14 on the support 6 to the glass tube 12, as shown in FIG. 1. With such a construction, since the electrodes 4 are not connected to the camera tube holder but instead are connected directly to the input 15 of the integrated circuit, the capacitance at the signal input is low. A further important advantage is that on the side of the target no glass leadthroughs are necessary and that a comparatively small cross-section of the window 5 will suffice which need not cover the whole cross-section of the tube 12 and hence can easily withstand the external pressure. Since the window extends at least up to the edge 9 of the support, the resultant assembly can withstand high pressures. For added protection, screening caps 17 and 18 (see FIG. 1) may also be provided.

In this embodiment the vacuum-tight seal between the window 5 and the edge portion 7 of the target is formed by an insulating layer, for example, a silicon oxide layer 19, which on the side of the incident radiation 3 extends over the target, the electrodes 4 and metal layers 10 thereon. In the embodiment of FIG. 1, the window 5 is secured to the insulating layer by means of transparent cement 20. However, it would in principle also be possible to cement the window directly to the target and the electrodes. By using the insulating glass or oxide layer 19, damage to the target, in particular to the thin central portion thereof, is minimized.

As in this embodiment, the edge portion 7 of the target on the side of the support 6, and the support 6 at the area of its contact face with the target, are preferably metallized. In the present example, the metallisation 21 also extends over the inner edge of the support 6, which, however, is not necessary.

As shown in FIG. 1, in a target assembly according to the invention, the usual gauze plate serving to promote perpendicular incidence of the electron beam can be provided in a particularly advantageous manner. As a matter of fact, this may be done by conductively connecting the edge 22 of the gauze plate 23 to the metallisation 14 provided on the edge of the support 6, so that the gauze plate 23 is integral with the target assembly.

Figure 2:
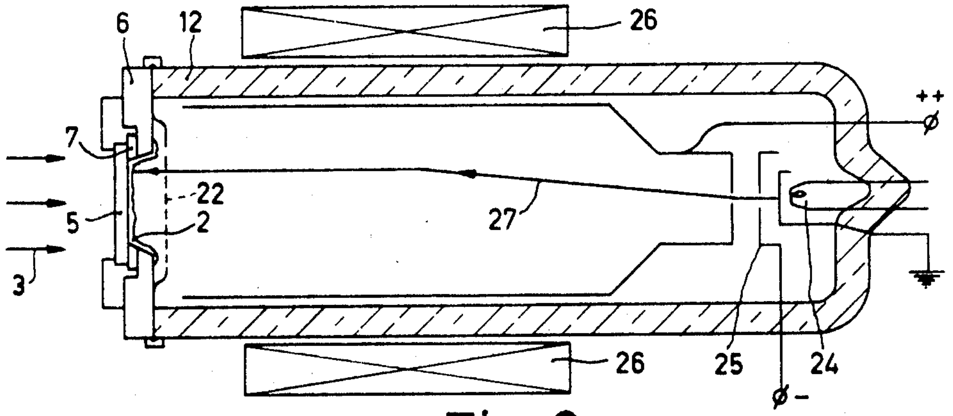
FIG. 2 is a diagrammatic cross-sectional view of a camera tube having a target assembly according to the invention.

FIG. 2 shows hows the target assembly is mounted in a camera tube according to the invention. In addition to the target assembly, the camera tube also comprises the usual means, such as a thermionic cathode 24, Wehnelt cylinder 25, deflection coils 26 etc., to form an electron beam 27 for scanning the side of the target remote from the incident radiation 3. The outer edge of the support 6 is secured in a vacuum-tight manner to the edge of the camera tube 12 on the side remote from the radiation 3.

Figure 3:
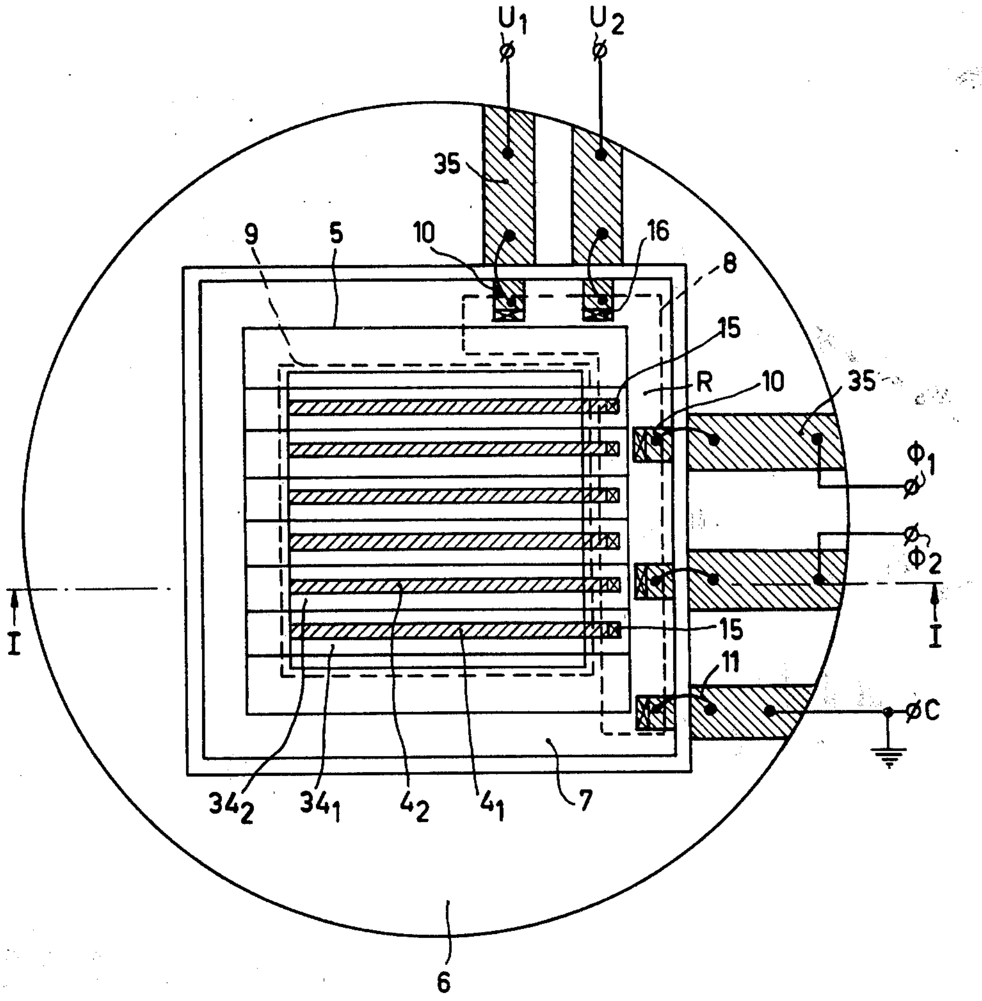

The target assembly as shown in FIGS. 1 and 3 is advantageously made, in accordance with the invention, in the following manner.

Figure 4:
Figure 5:
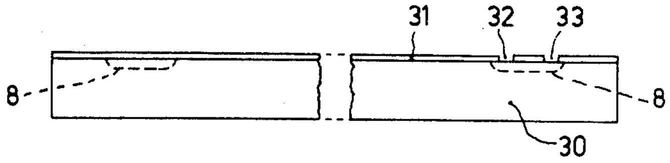

The starting material shown in FIG. 4 is a semiconductor plate 30, for example, of p-type silicon, having a resistivity of, for example, 6 ohm·cm and, for example an orientation (100). Theplate 30 has a substantially homogeneous thickness of 250 microns. By using doping methods conventionally used in semiconductor technology, for example, diffusion or ion implantation which are of no essential importance for the invention and will therefore not be described in detail here, an integrated circuit is formed on one side in an edge portion of the plate. The integrated circuit, which may have a variety of shapes, is shown diagrammatically in FIG. 5 by broken lines 8. During the fabrication of the integrated circuit, an oxide layer 31 is formed on the plate 30 which in this example, although not strictly necessary, is removed from the lower side of the plate. Contact windows 32 and 33 for connecting conductors to the integrated circuit are photolithographically etched in the layer 31 in the usual manner.

Figure 6:
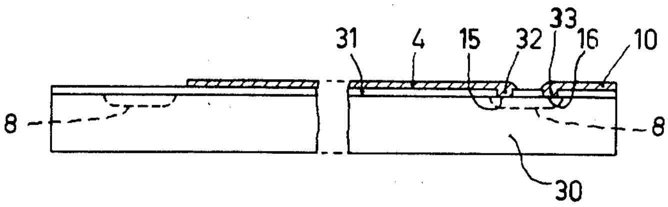

The central portion of plate 30 is now provided with at least one radiation pervious electrode 4 on the side thereof where the integrated circuit is situated. In this example, several mutually parallel stripe-shaped electrodes 4 are provided, which may, for example, consist of layers of $SnO_2$ and/or $InO_2$ with a thickness, for example, of 0.2 micron. FIG. 6 is a cross-sectional view of one of the electrodes 4. In certain circumstances, however, one single electrode 4 covering the entire central portion of the plate might also be used. The electrodes 4 are each connected to an input 15 of the integrated circuit via a window 32. The $SnO_2$ layer is obtained, for example, by vapour deposition (see, for example, "Thin Solid Films" vol. 33, 1976, page 15) or spraying. The layer is given the shape of stripe-shaped electrode layer 4, for example, by covering the layer with a chromium mask and sputtering away the unmasked part of the layer, after which the chromium is removed.

The output connections 16 of the integrated circuit are provided with metal layers 10, for example aluminum layers, which extend, on the edge portion of the plate, on the oxide layer 31 and adjoin join the integrated circuit via the windows 53 as shown in FIG. 6. These layers are provided by vapour-depositing aluminum and etching to the desired shape by using conventional photolithographic etching methods. A 0.6 micron thick protecting silicon oxide layer 19 is then deposited pyrolytically over the assembly. This, however, is not strictly necessary for the invention.

Figure 7:
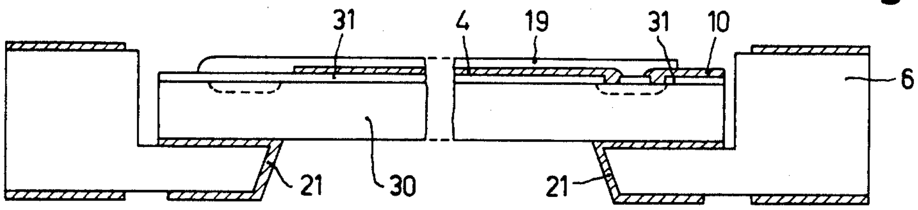
Figure 8:
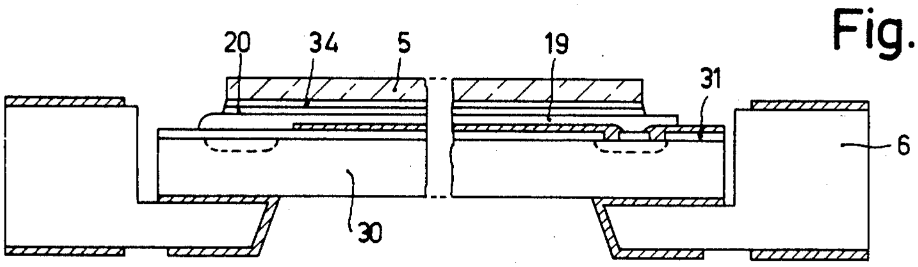
Figure 9:
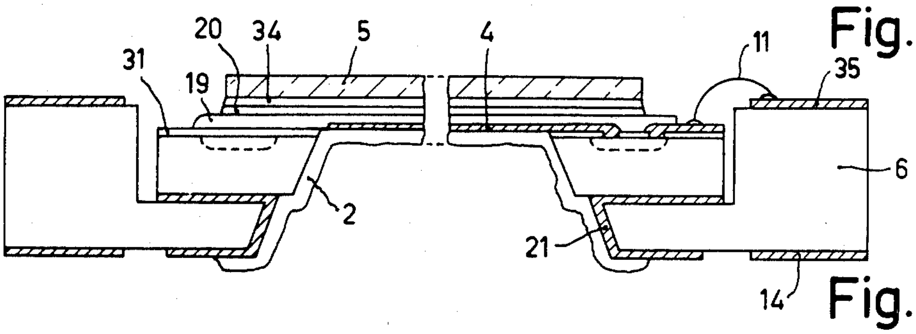

The edge portion of the semiconductor plate 30 is then secured in a vacuum-tight manner to the side to an annular support 6 as shown in FIG. 7. The support 6 is of electrically insulating material, in this example a ceramic. The edges of the support are metallized, for example, with a layer 21 of copper or aluminum. Since in this example the oxide layer 31 has been removed from the lower side of the plate 30, same can easily be provided with its edge, for example via a silicon-gold alloy, to the metallisation 21 of the support. When the oxide layer 31 is not removed from the lower side of the plate, another method of vacuum-tight sealing or cementing can be used.

A window 5, which is permeable to the incident radiation, is then secured to the side of the assembly where the integrated circuit is situated. In this case, the window is made of glass having a thickness of a few millimeters, for example, between 1 and 6 mm, and is provided with a colour filter 34 formed by vapour-deposited stripes having different spectral permeabilities which alternately pass three complementary colours, for example, red, green and blue. These stripes consist, for example, of $TiO_2$-$SiO_2$ layers. The stripes $34_1$, $34_2$ and so on of the colour filter 34 are each positioned opposite to an electrode stripe $4_1$, $4_2$ and so on. The filter and electrode stripes can be aligned directly in a simple manner, after which the filter side of the window is secured to the oxide layer 19 by means of a transparent cement layer 20. The diameter of the window 5 is chosen to be such that, in projection, it extends at least up to or overlaps the inner edge of the support 6.

The central part of the silicon plate on the side facing the support 6, is then etched away, for example, in an etching bath containing KOH, $K_2Cr_2O_7$ and isopropanol, or in a hydrazine-containing etchant. The remaining parts of the assembly are protected against etching by an etching mask not shown in the drawing. Etching is discontinued automatically when the silicon is etched through throughout its thickness, since the silicon oxide layer 31 is largely unaffected by the etching bath. In a second etching step, for example, with a HF-containing etchant, the oxide layer 31 is then removed on the central part of the plate until the electrode layers 4 are exposed. A radiation-sensitive layer 2, in this example 1 micron thick antimony trisulphide ($Sb_2S_3$) is then provided on the electrode layers 4 and on the edge of the plate 30 by vapour-deposition in a vacuum through a mask. If desired, at this stage, the conductors 11 may also be provided which adjoin the metallized portions 35 of the support 6.

In principle, the target assembly is now ready. If desired, a gauze plate 23, for example of copper gauze, may now be conductively connected at its edge 22 to the metallisation 14 of the support 6, for example, by spot welding. Thereafter, the assembly may be secured by an indium weld 13 to the glass envelope 12 of the camera tube as shown in FIGS. 1 and 2. The tube with its further components may then be assembled in a known manner.

It should be noted that if the target is sensitive to infrared radiation instead of visible light, the electrode layer 4 may also be made advantageously from polycrystalline silicon. The way in which a target of this type can be used is described in detail in the above-mentioned U.S. Pat. No. 4,059,840. Moreover, the operation will be described in outline with reference to FIGS. 10 to 13.

Figure 10:
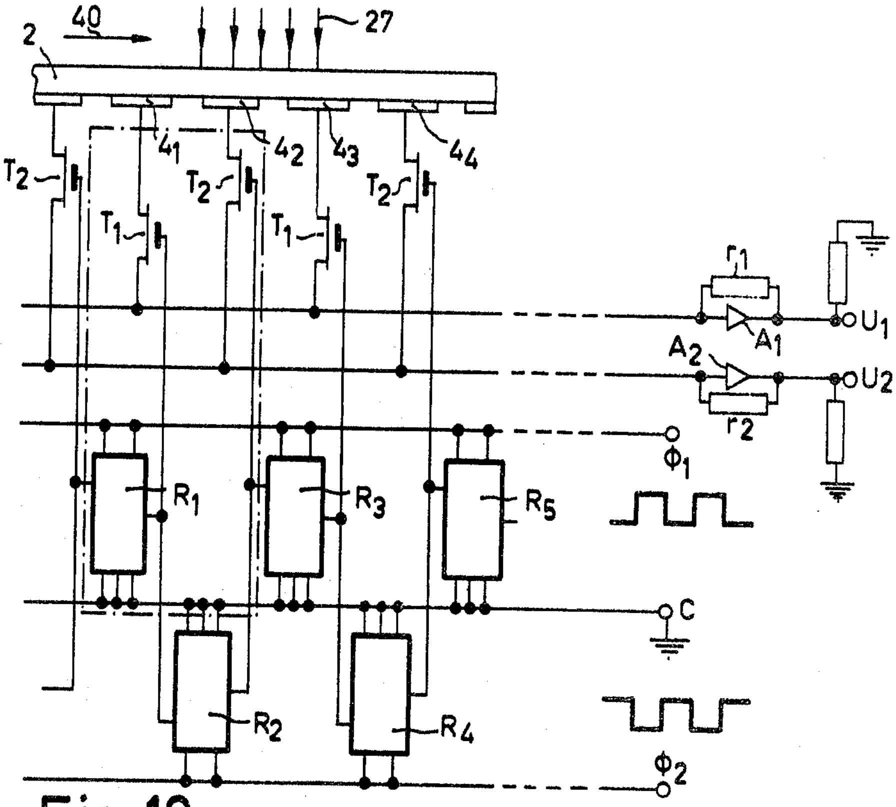
FIG. 10 shows diagrammatically a circuit arrangement in which the target is incorporated.

FIG. 10 shows diagrammtically the circuit for processing the data supplied by the target of the camera tube. A radiation image is incident on the radiation-sensitive layer 2 through the transparent electrode stripes $4_1$, $4_2$ and so on. Prior to the incidence of the radiation, the opposite surface of the target is brought to the potential of the electron gun, which in this example is connected to ground, by scanning it with the electron beam 27. As a result of the incident radiation, the capacitances formed by the portions of the layer 2 underlying the stripes 4 are discharged to a greater or lesser extent. As a result, a potential image corresponding to the radiation image is formed on the radiation-sensitive layer 2. By again scanning the layer 2 with the electron beam 27 in a direction normal to that of the stripes 4 (the direction of the arrow 40 in FIG. 10), the scanned surface is once more brought to ground potential and the potential image is transferred to the stripes 4. From the stripes 4 the signal is transferred in this example to two outputs $U_1$ and $U_2$ by alternately closing switches which are formed by MOS transistors $T_1$ and $T_2$. For that purpose the electrode stripes 4 are divided into two groups, the transistors $T_1$ being connected to the stripes $4_1$, $4_3$ and so on, the transistors $T_2$ being connected to the intermediate stripes $4_2$, $4_4$ and so on. Only a few stripes 4 are shown in FIGS. 3 and 10, their number actually being usually 400 to 800.

When, for example, the transistor $T_1$ associated with the electrode stripe $4_1$ becomes conductive, the capacitance associated with that stripe is discharged via the output line $U_1$ in which an amplifier $A_1$ with feed back resistor $r_1$ is incorporated. A corresponding video signal appears at the output $U_1$ and is processed in the usual manner in a further circuit not shown. The stripes $4_2$, $4_4$ and so on similarly provide a video signal at the output $U_2$ via the amplifier $A_2$ with feed back resistor $r_2$.

Figure 11:
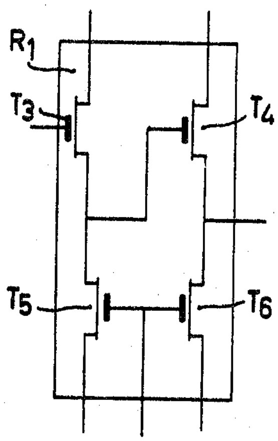
FIG. 11 shows a detail of the circuit arrangement shown in FIG. 10.

The voltage pulses at the gate electrodes of the transistors $T_1$ and $T_2$ with which these are made conductive are supplied by a shift register R with identical stages $R_1, R_2, \ldots R_n$. In this example the shift register is of the type described in I.E.E.E. International Solid State Circuits Conference, February 1971, pages 130–131. FIG. 11 shows the electrical circuit diagram of one stage ($R_1$); each stage comprises four MOS transistors $T_3$ to $T_6$. The shift register R has a ground connection C; the odd stages $R_1$, $R_3$ and so on and the even stages $R_2$, $R_4$ and so on are operated with clock pulses $\phi_1$ and $\phi_2$, respectively, the shape of which is shown diagrammatically in the figure. A starter pulse introduced at the beginning of the shift register on a transistor $T_3$ is passed through the register by the clock pulse and provides in each stage a voltage at the gate electrode of the field effect transistor connected to that stage ($T_1$, $T_2$, respectively), so that said transistor becomes conductive at that instant and provides an output signal at $U_1$ and $U_2$, respectively. The target is read out in this manner, with the read out being repeated after each frame scan period.

Figure 13:
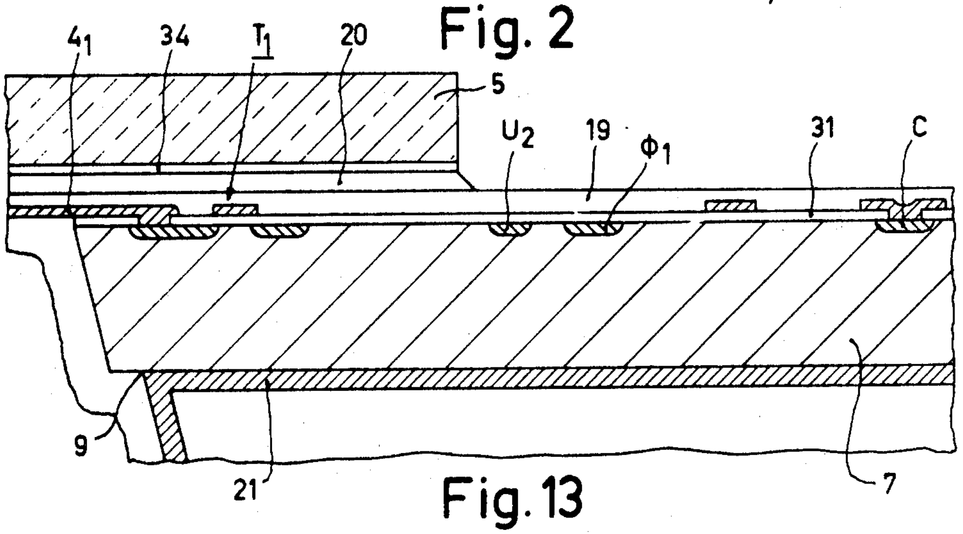
FIG. 13 is a diagrammatic cross-sectional view taken on the line XIII—XIII of FIG. 12.
Figure 3A:
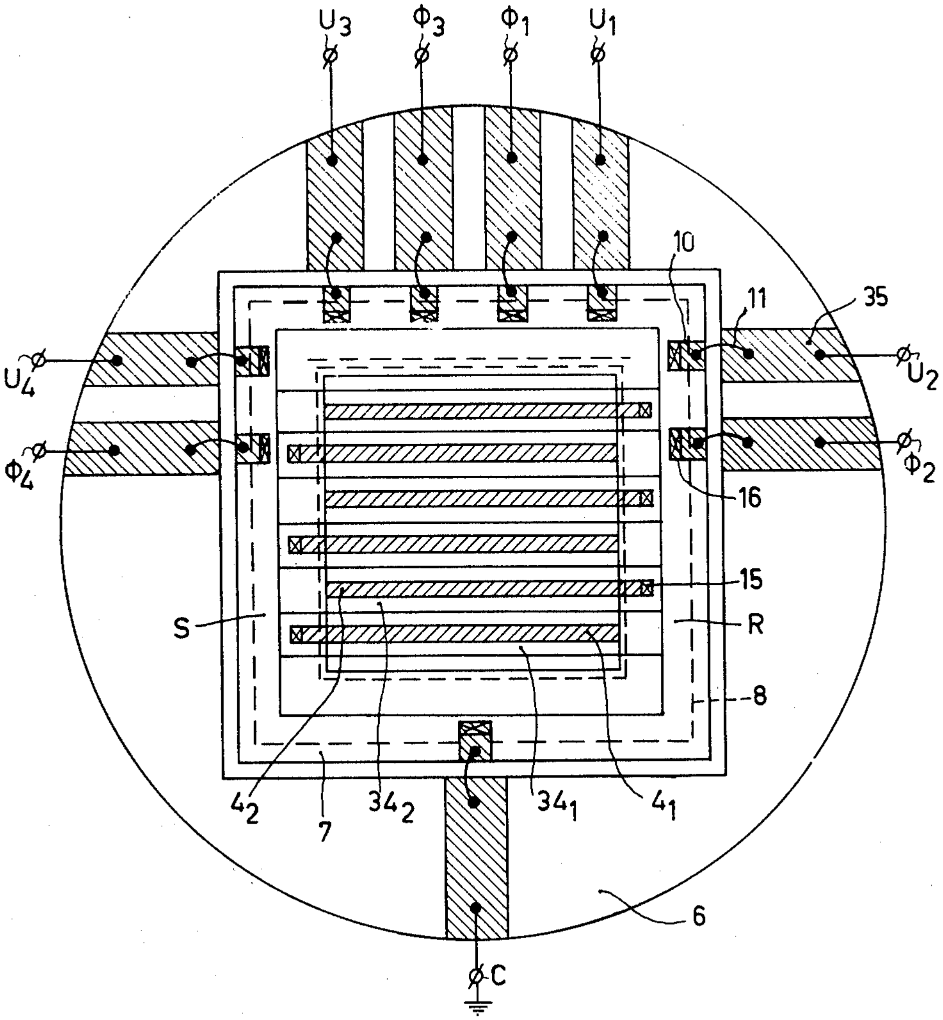
FIG. 3*a* shows a modified embodiment of FIG. 3, FIGS. 4 to 9 are diagrammatic cross-sectional views of a target assembly according to the invention in successive stages of manufacture.
Figure 12:
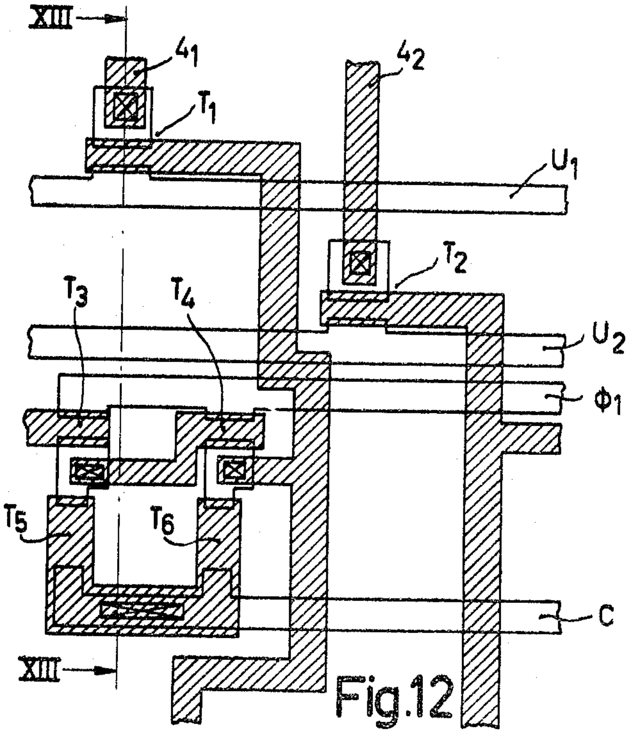
FIG. 12 is a plan view of a part of the circuit arrangement shown in FIG. 10.

According to the invention, in this example the transistors $T_1$ and $T_2$, as well as the shift register, are incorporated in an integrated circuit in the edge portion 7 of the target. For illustration, the plan view of FIG. 12 shows the part which in FIG. 10 is surrounded by the dot-and-dash line, while FIG. 13 is a diagrammatic cross-sectional view through a part of the edge 7 of the target taken on the line XIII—XIII of FIG. 12. In FIGS. 3, 3*a* and 12 the contact holes are denoted by a diagonal cross, the metal layers are shaded and the boundaries of the n-type zones diffused in the n-type region 7 are denoted by solid lines. For simplicity, the oxide layer 31 in FIG. 13 is shown as having the same thickness everywhere, which means that differences in thickness between field oxide and gate oxide have been neglected; details, for example the usual channel-stopping zones, are also omitted. As shown in FIGS. 12 and 13, the conductors $U_1$, $U_2$ $\phi_1$, $\phi_2$ and C are formed by highly doped n-type zones which are contacted elsewhere on the plate. The further connections and the gate electrodes are formed by metal layers extending on the oxide layer 31. According to a modified embodiment which is shown diagrammatically in the plan view of FIG. 3*a*, the edge portion 7 of the plate can be used more efficiently by connecting the electrode stripes 4 alternately on oppositely located sides of the plate to two opposite shift registers $R_{1 \ldots n}$ and $S_{1 \ldots n}$, having outputs and clock voltages, $U_1$, $U_2$, $\phi_1$, $\phi_2$ and $U_3$, $U_4$, $\phi_3$ and $\phi_4$, respectively, and a common connection C, while the clock voltages may be coupled mutually, if desired. A further modified embodiment can be obtained by connecting together the electrode stripes 4, for example in three groups (for three complementary colours), and reading out. If desired, the amplifiers $A_1$ and $A_2$ may also be incorporated in the edge portion of the semiconductor plate.

As shown in the figures, according to the invention only, a small number of leadthroughs are necessary in spite of a large number of electrode stripes, for which glass leadthroughs are not necessary in the target assembly according to the invention.

The construction with stripe-shaped electrodes and with the use of shift registers has been given only by way of example; the construction of the electrode layer or layers 4 and of the integrated circuit may be varied at will. Shift registers of a type quite differing from the registers described here may also be used.

What is claimed is:

1. A method of making a target assembly for converting incident radiation into electrical signals for use in a camera tube or the like comprising the steps of:

forming an integrated circuit for processing electrical signals in a peripheral portion of a semiconductor plate; and providing at least one electrode which is permeable to said radiation and which is connected to an input of said integrated circuit on a central portion of one side of said plate; and then, in the following order:

securing a window permeable to said radiation to said one side of the plate over said electrode;

forming an opening in a central portion of the other side of said plate to expose a portion of the surface of said electrode remote from said window; and applying a radiation-sensitive layer to at least said exposed surface portion of said electrode.

2. The method according to claim 1 including the step of providing, on a peripheral portion of said plate, a conductive layer which is connected to an output of said integrated circuit.

3. The method according to claim 2 including the step of securing, in a vacuum tight manner, an annular support of electrically insulating material to said other side of said plate in a manner such that the edge of said window extends at least up to the inner edge of said annular support.

4. The method according to claims 1, 2 or 3 wherein said opening is formed by etching through said central portion of said plate.

5. The method according to claim 4 wherein said plate is of substantially uniform thickness prior to said etching step.

6. The method according to claim 4 wherein said step of providing said electrode includes applying a plurality of spaced, stripe-shaped, mutually parallel permeable electrodes on said one side of said plate.

7. The method according to claim 4 wherein said window overlaps said inner edge of said support.

8. A method of making a camera tube having an envelope with a target assembly at one end and means arranged in the opposite end of said envelope for producing an electron beam for scanning the target, said method comprising the steps of:

forming an integrated circuit for processing electrical signals in a peripheral portion of a semiconductor plate;

providing, on a central portion of one side of said plate, at least one electrode which is permeable to incident radiation and which is connected to an input of said integrated circuit;

providing, on a peripheral portion of said plate, at least one conductive layer which is connected to an output of said integrated circuit; and securing, in a vacuum tight manner, an annular, electrically insulating support to the other side of said plate; and then, in the following order:

securing a window permeable to said radiation to said one side of said plate over said electrode in a manner such that the edge of said window extends at least up to the inner edge of said annular support and said conductive layer extends beyond said window;

removing material from the central portion of the other side of said plate to expose a portion of the surface of said electrode remote from said window;

applying a radiation sensitive layer to at least the exposed surface portion of said electrode to thereby form said target assembly; and securing said target assembly to said one end of said envelope.

* * * * *